(12) United States Patent
Yu et al.

(10) Patent No.: US 6,643,790 B1
(45) Date of Patent: Nov. 4, 2003

(54) DUTY CYCLE CORRECTION CIRCUIT WITH FREQUENCY-DEPENDENT BIAS GENERATOR

(75) Inventors: Leung Yu, Los Altos, CA (US); Roxanne Vu, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/519,169

(22) Filed: Mar. 6, 2000

(51) Int. Cl.[7] .................................................. G06F 1/04
(52) U.S. Cl. ........................................ 713/500; 327/175
(58) Field of Search ................................. 713/500, 501, 713/503; 327/170, 172, 175

(56) References Cited

U.S. PATENT DOCUMENTS

| | | | | |
|---|---|---|---|---|
| 4,527,075 A | * | 7/1985 | Zbinden ..................... | 327/175 |
| 5,696,724 A | * | 12/1997 | Koh et al. ................... | 365/205 |
| 5,696,726 A | * | 12/1997 | Tsukikawa ................... | 365/205 |
| 5,940,606 A | * | 8/1999 | Ghia et al. ................... | 711/100 |
| 5,945,857 A | * | 8/1999 | Havens ....................... | 327/175 |
| 6,084,452 A | * | 7/2000 | Drost et al. .................. | 327/175 |
| 6,169,434 B1 | * | 1/2001 | Portmann .................... | 327/175 |
| 6,181,178 B1 | * | 1/2001 | Choi .......................... | 327/175 |
| 6,369,626 B1 | * | 4/2002 | Donnelly et al. ............. | 327/157 |

* cited by examiner

Primary Examiner—Dennis M. Butler
(74) Attorney, Agent, or Firm—Vierra Magen Marcus Harmon & DeNiro LLP

(57) ABSTRACT

A duty cycle correction circuit operates by alternately speeding and slowing successive transitions of an input clock signal. By altering the rising and falling edge rates of a clock signal asymmetrically, the duty cycle of the clock signal is adjusted without shifting the DC level of the clock signal. In one embodiment, the duty cycle correction circuit includes current sources in place of resistive loads to avoid shifting the DC level of output clock signals. Frequency-dependent current sources that generate increased bias currents at higher frequency are used to achieve duty cycle correction over a broad range of input frequencies.

27 Claims, 5 Drawing Sheets

US 6,643,790 B1

DUTY CYCLE CORRECTION CIRCUIT WITH FREQUENCY-DEPENDENT BIAS GENERATOR

FIELD OF THE INVENTION

The present invention relates to signal conditioning systems, and more particularly to apparatus and methods for correcting duty cycle distortion.

ART BACKGROUND

In many electronic circuit applications, it is desirable to generate a clock signal having a duty cycle as near to 50% as possible. For example, in chip-to-chip signaling applications in which data is transmitted or received on both rising and falling edges of a clock, it is important that successive rising and falling edges of the clock signal are evenly spaced in time. Otherwise, setup and hold requirements of signaling components may be not be met during the shorter half-cycle. Applications that employ delay-locked loop (DLL) circuits are also sensitive to uneven spacing between successive rising and falling clock signal edges, particularly when they include mixing circuitry operating at the same frequency as the reference clock. In that case, uneven spacing between successive rising and falling edges of the incoming clock signal usually results in unequal spacing in the phase offsets of the mixer output signals, degrading the delay locking performance of the circuit.

FIGS. 1A, 1B and 1C illustrate a prior art duty cycle correction circuit 12 and corresponding input and output clock waveforms. The duty cycle correction circuit 12, referred to herein as a level-shifting corrector, receives an input clock signal (ICLK) and its complement (ICLK\) at respective inputs of a differential amplifier pair 14A, 14B. The differential pair 14A, 14B is biased by a current $I_1$ drawn by a constant current source 15. The drain nodes of the differential pair, $N_1$ and $N_2$, are coupled to a supply voltage through respective resistive elements $R_1$ and $R_2$ (typically implemented by diode-configured transistors), and are coupled to ground through respective capacitive elements $C_1$ and $C_2$. Nodes $N_1$ and $N_2$ are also coupled to inputs of a buffer circuit 18 which isolates output clock signals OCLK and OCLK\.

Looking at the left leg of the differential pair 14A, 14B, as ICLK goes high, the voltage at $N_1$ begins to be pulled down through $R_1$, discharging $C_1$. Conversely, when ICLK goes low, the voltage at $N_1$ is pulled up through $R_1$, charging $C_1$ with time constant $R_1C_1$. The net effect of this operation is to produce an output clock signal, OCLK, which is inverted and has slowed rising and falling edges relative to ICLK. The resistive and capacitive elements are balanced between the right and left legs (i.e., $R_2=R_1$ and $C_2=C_1$), so the right leg of the differential pair produces OCLK\ with similar inversion and slowed rising and falling edges relative to ICLK\.

A second differential amplifier pair 16A, 16B is coupled to nodes $N_1$ and $N_2$, and is biased by a current $I_2$ drawn by constant current source 17. A charge pump 21 is coupled to receive the output clock signals, OCLK and OCLK\, and to charge capacitive elements $C_3$ and $C_4$ to steady state voltages according to the respective on-times of the output clock signals. Thus, if OCLK and OCLK\ are each at precisely 50% duty cycle, the voltage developed on C3 and C4 is equal, resulting in equal currents through the left and right legs of the second differential amplifier pair 16A, 16B (i.e., $I_{S1}=I_{S2}$) In this case, and currents $I_{S1}$ and $I_{S2}$ are said to be at level bias ($I_2/2$), and OCLK and OCLK\ each swing equally about a threshold voltage ($V_{MID}$), that is midway between nominal high and low signal levels. By contrast, if the duty cycle of OCLK exceeds 50% (meaning that the duty cycle of OCLK\ is correspondingly less than 50%), a higher voltage is developed on C4 than on C3 causing $I_{S1}$ to exceed level bias and $I_{S2}$ to fall below level bias. An increased steady state voltage drop across $R_1$ results from the increased $I_{S1}$, and causes the DC level of OCLK to shift downward by an amount equal to $(I_{S1}-I_2/2)*R_1$. Conversely, a decreased steady state voltage drop across $R_2$ results from the decreased $I_{S2}$ and causes the DC level of OCLK\ to shift upward by an amount equal to $(I_2/2-I_{S2})*R_2$.

FIGS. 1B and 1C illustrate the situation described above, in which the duty cycle distortion in ICLK and ICLK\ result in a downward shift in the DC level of OCLK and an upward shift in the DC level of OCLK\. The duty cycle distortion in ICLK and ICLK\ is indicated by the uneven time periods ($T_1$ and $T_2$) for the half cycles that make up each complete clock cycle ($T_P$). Because the rising and falling edges of OCLK and OCLK\ have been slowed relative to the input clock signals, shifts in the levels of OCLK and OCLK\ have a pronounced effect on the time at which midpoint crossings occur. In particular, the downward shift of OCLK and the upward shift of OCLK\ delays the start of period $T_1$ and advances the end of period $T_1$ relative to the same period of the input clocks. Conversely, the start of period $T_2$ is advanced and the end of period $T_2$ is delayed. The net effect is to shorten the longer of the two time periods, $T_1$, and to extend the shorter of the two time periods, $T_2$, thus providing output clock signals having approximately 50% duty cycle.

The level shifting duty cycle corrector of FIG. 1 has a number of undesirable characteristics. One such characteristic is that the capacitive components used to reduce the edge rates of the input clock signals must usually be selected according to a specified input clock frequency. If the circuit is operated above the specified frequency, the RC circuits used to slow the output clock edge rates may prevent the output clock signals from reaching full swing. Consequently, the output clock signals may be lost altogether if the level shifting circuit shifts the DC level such that the reduced differential swing prevents the output clock signals from crossing $V_{MID}$. Conversely, if the circuit is operated at a lower than specified frequency, the edge rate reduction may be insufficient to produce the required level of duty cycle correction when the DC levels of the output clocks are shifted.

One solution to the above problem is to provide additional capacitive elements that may be selectively coupled in parallel with $C_1$ and $C_2$. For example, $C_1$ and $C_2$ may be specified according to a lowest anticipated input clock frequency, and passgates or fusible logic may be used to couple additional capacitive elements as necessary to support higher input clock frequencies. For run-time configurability, register settings may be established at system start-up to couple additional capacitive elements according to a run-time determined input clock frequency. Unfortunately, these solutions generally involve additional circuitry along with factory setting or run-time support, increasing overall system cost and complexity.

Another undesirable characteristic of the level shifting duty cycle corrector of FIG. 1 is that the level shifting circuitry itself does not scale well with frequency. Generally, the amount of DC shift required to provide duty cycle correction is inversely related to the frequency of the input clock. That is, a smaller DC shift is required at a higher frequency to provide the same percentage duty cycle correction that would be produced by a larger DC shift at a lower frequency. Unfortunately, the negative feedback loop in the level shifting duty cycle corrector shifts the DC level of the output clock signals according to the duty cycle distortion in the input clock waveform and essentially independently of the frequency of the input clock signal. Thus, even though a smaller DC shift is desired at higher frequency to correct a given percentage distortion, the level shifting corrector produces roughly the same DC shift over a wide range of frequencies.

Yet another undesirable characteristic of the level shifting duty cycle corrector of FIG. 1 is that the circuit's operation is relatively sensitive to process variations in its components. Relatively wide variances in resistive and capacitive elements are typical, as are relatively wide variances in the edge rate and drive strength of the components used to implement the current sources that draw $I_1$ and $I_2$. "Fast components," which tend to form smaller-valued resistive and capacitive elements, also tend to form stronger current sources. By contrast, "slower components" tend to form larger-valued resistive and capacitive elements, but weaker current sources. Unfortunately, this inverse relationship between the RC product and current source strength is exactly opposite that needed in the level shifting corrector of FIG. 1—a stronger current source is needed to discharge a larger capacitance, and a weaker current source is needed to discharge a smaller capacitance in the same time. Consequently, a relatively small variation between fast and slow components is tolerable in the level shifting corrector of FIG. 1, tending to reduce the yield of acceptable parts and correspondingly increase production costs.

SUMMARY OF THE INVENTION

Apparatus and methods for correcting duty cycle distortion in a clock signal are disclosed. In at least one embodiment, the apparatus includes circuitry to detect duty cycle distortion in an input clock signal and circuitry to asymmetrically adjust the edge rates of successive rising and falling edges of the clock signal to reduce the duty cycle distortion.

These and other features and advantages of the present invention will be apparent from the accompanying drawings and from the detailed description that follows.

BRIEF DESCRIPTION OF FIGURES

The present invention is illustrated by way of example, and not by way of limitation, in the figures of the accompanying drawings and in which like reference numerals refer to similar elements and in which.

DETAILED DESCRIPTION

A duty cycle correction circuit which operates by alternately speeding and slowing successive transitions of an input clock signal is disclosed in various embodiments. By altering the rising and falling edge rates of a clock signal asymmetrically, the duty cycle of the clock signal is adjusted without shifting the DC level of the clock signal. In one embodiment, the duty cycle correction circuit includes current sources in place of resistive loads, avoiding DC shift in the output clock signals. Further, by using frequency-dependent current sources that generate increased bias currents at higher frequency, duty cycle correction can be achieved over a broad range of input frequencies without having to provide configurable or fusible circuitry. Also, by designing the frequency-dependent current sources to include components which result in lower bias currents in duty cycle correctors that have smaller charging capacitors, relatively large process variations can be tolerated.

Figure 1A:
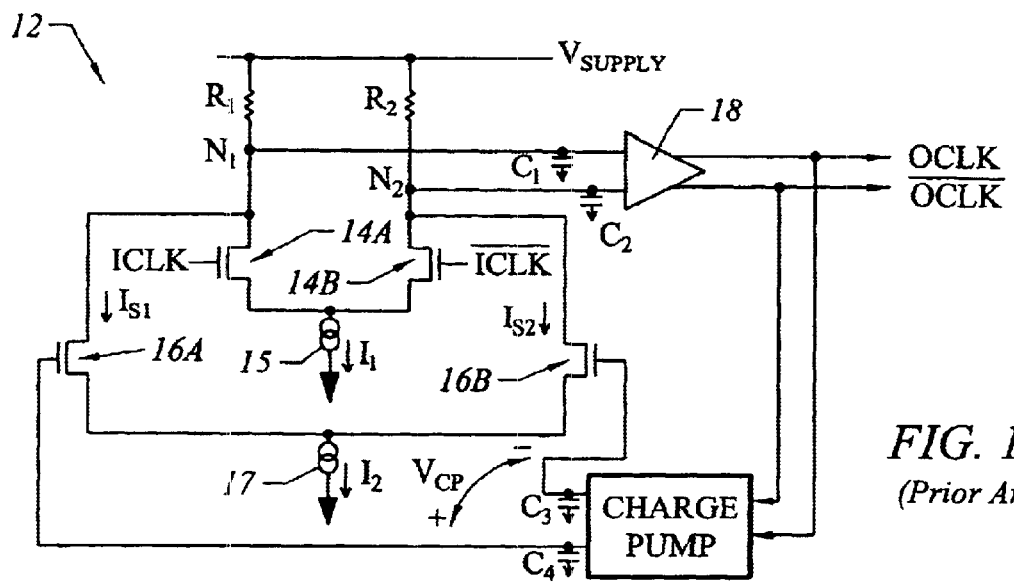
FIGS. 1A, 1B and 1C illustrate a prior art level-shifting duty cycle correction circuit and corresponding input and output clock waveforms.
Figure 1B:
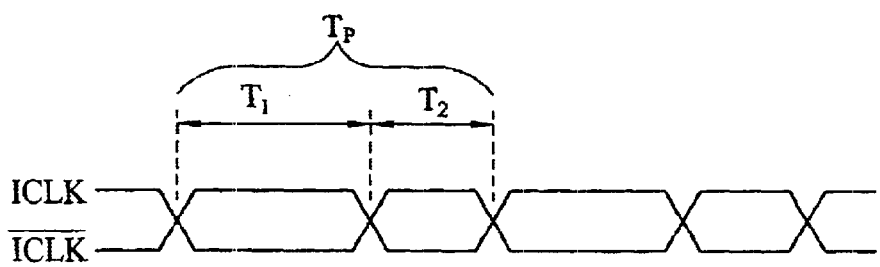
Figure 1C:
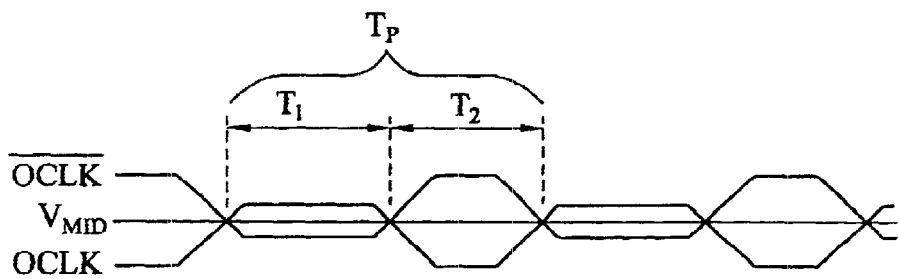
Figure 2A:
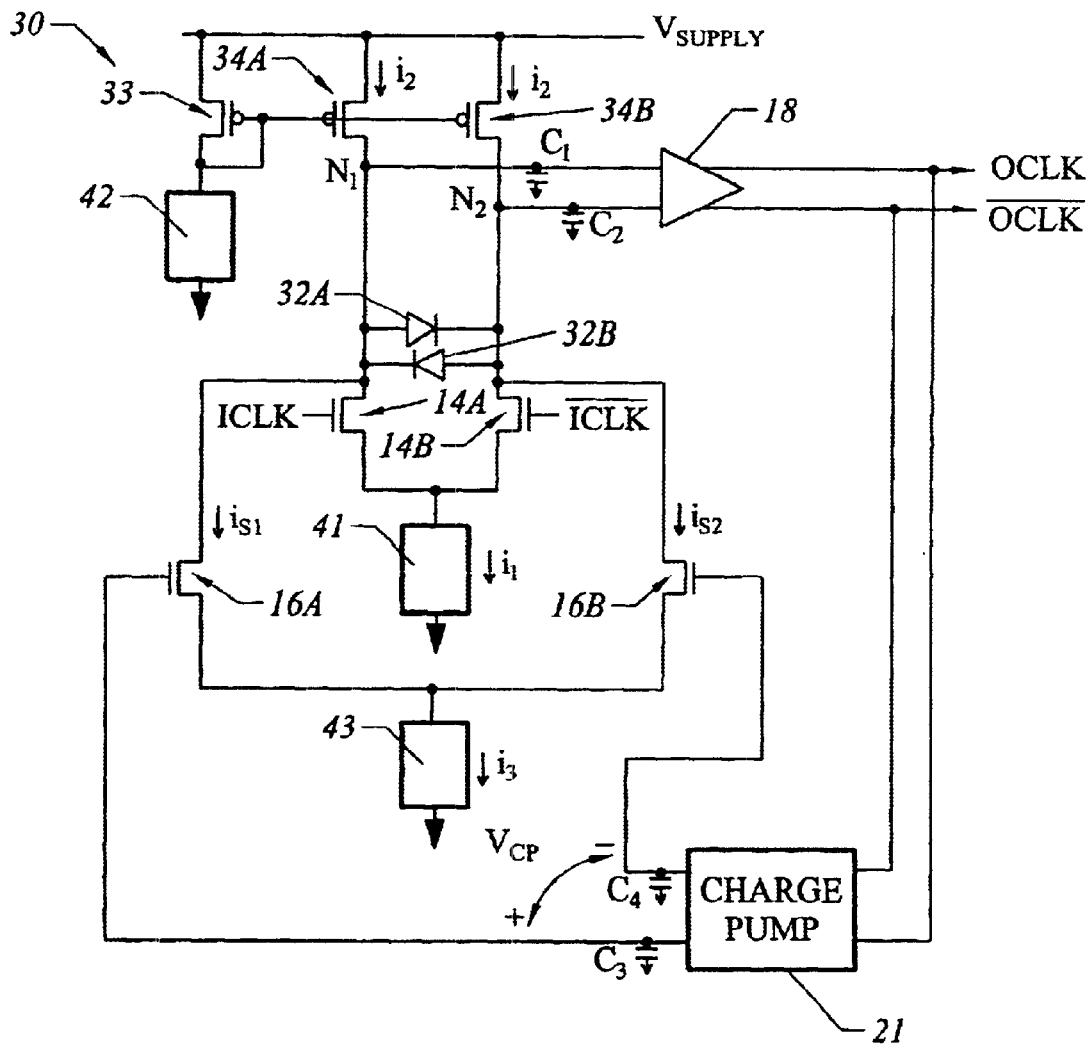
FIG. 2A illustrates an edge-based duty cycle correction circuit for correcting duty cycle distortion in an input clock signal according to an embodiment of the present invention.

FIG. 2A illustrates an edge-based duty cycle correction circuit 30 for correcting duty cycle distortion in an input clock signal according to an embodiment of the present invention. Herein the expression "duty cycle" refers to the time a periodic signal remains above a nominal midpoint voltage divided by the period of the signal. A clock signal is said to have duty cycle distortion if its duty cycle is greater than or less than 50%.

The edge-based duty cycle corrector 30 receives an input clock signal (ICLK) and its complement (ICLK\) at respective inputs of a differential amplifier pair 14A, 14B. The differential pair 14A, 14B is biased by a current, $i_1$, generated by a frequency-dependent current source 41. The drain nodes of the differential pair, $N_1$ and $N_2$, are coupled to a supply voltage ($V_{SUPPLY}$) through respective p-MOS transistors 34A, 34B coupled in a current mirror configuration with p-MOS transistor 33. Transistor 33 is biased by a second frequency-dependent current source 42 such that frequency-dependent bias current $i_2$ is supplied to each of nodes $N_1$ and N2 through p-MOS transistors 34A and 34B, respectively. Nodes $N_1$ and $N_2$ are coupled to ground through respective capacitive elements $C_1$ and $C_2$, and also to inputs of a buffer circuit 18 which isolates output clock signals OCLK and OCLK\. A second differential amplifier pair 16A, 16B is coupled to $N_1$ and $N_2$, and is biased by a current, $i_3$, generated by a third frequency-dependent current source 43. A charge pump 21 is coupled to receive the output clock signals, OCLK and OCLK\, and to charge capacitive elements $C_3$ and $C_4$ to steady state voltages according to the respective on-times of the output clock signals.

According to one embodiment, the following relationship exists between currents $i_1$, $i_2$ and $i_3$: $i_2 = K(i_1+i_3)$, where $K>0.5$. Consequently, the total current sourced by transistors 34A, 34B (i.e., $2i_2$) exceeds the sum of bias currents $i_1$ and $i_3$, with the excess being used to alternately charge capacitors $C_1$ and $C_2$. Thus, when ICLK goes low, current ceases to flow through transistor 14A, and constant current $i_2$ pulls $N_1$ up to approximately $V_{SUPPLY}$, charging $C_1$. At the same time, a high going ICLK\ causes $i_1$ to flow through transistor 14B, pulling the voltage at $N_2$ down and discharging $C_2$. When the voltage at $N_2$ falls sufficiently below the voltage at $N_1$, diode $D_1$ (e.g., a diode configured transistor) begins conducting and clamps the voltage at $N_2$ to a diode drop below the voltage at $N_1$. When ICLK goes high and ICLK\ goes low, the situation is reversed. $C_1$ discharges while $C_2$ charges, and diode $D_2$ clamps the voltage at $N_1$ to a diode drop below the voltage at $N_2$. Although diodes are shown in FIG. 2A, any circuit or device for limiting the low-going swing of nodes $N_1$ and $N_2$ may be used in alternate embodiments. Further, any number of additional diodes (or other fixed drop circuit elements) may be coupled in series with each of $D_1$ and $D_2$ to increase the differential swing at nodes $N_1$ and $N_2$. Also, in an alternate embodiment, diodes $D_1$ and $D_2$ may be omitted altogether so that the low-going swing of nodes $N_1$ and $N_2$ stabilizes according to the impedances presented by the sourcing and sinking current sources.

So long as the input clock signals have equal duty cycle (i.e., 50% duty), capacitors $C_1$, and $C_2$ will alternately be charged to the same potential. As a result, substantially equal voltages are developed on capacitors $C_3$ and $C_4$ by the charge pump 21, so that an error signal formed by differential voltage $V_{CP}$ remains at or near zero. In this state, referred to as a balanced bias state, currents $i_{S1}$ and $i_{S2}$ are substantially equal and therefore contribute equally to slow the charge and speed the discharge of $C_1$ and $C_2$, respectively. Current sources 41, and 43 are preferably selected such that, in the balanced bias state, the $C_1$ charge current equals the $C_1$ discharge current and the $C_2$ charge current equals the $C_2$ discharge current.

Figure 2B:
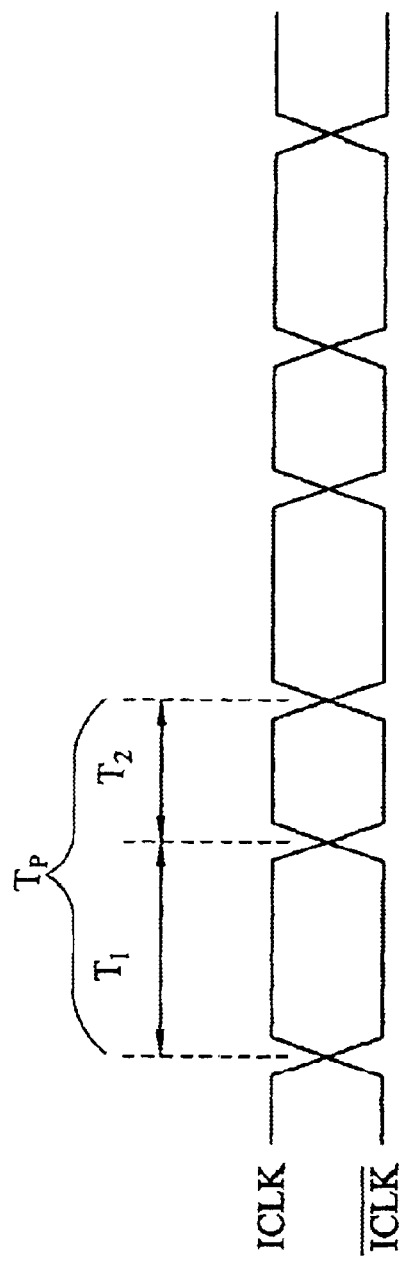
FIG. 2B illustrates complementary input clock signals having distorted duty cycles.
Figure 2C:
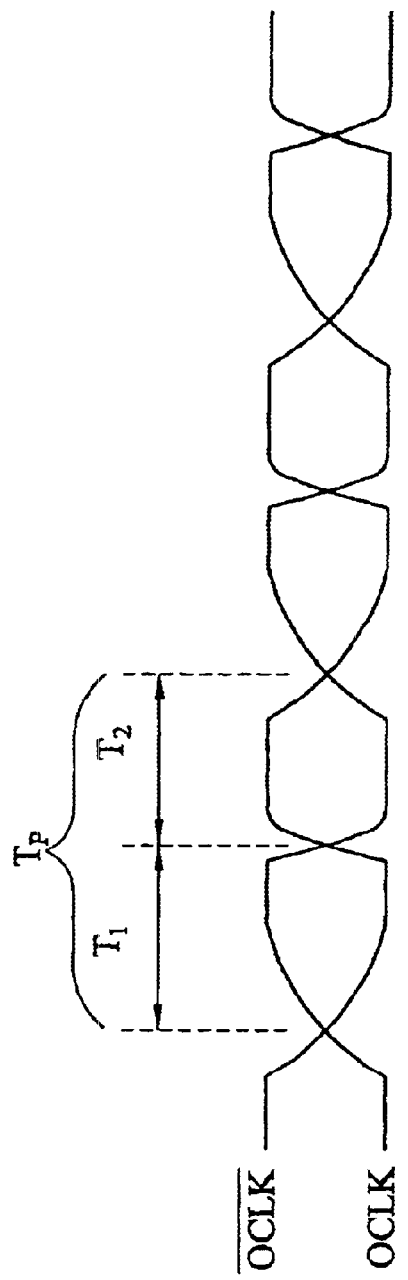
FIG. 2C illustrates duty cycle corrected clock signals output by the edge-based duty cycle correction circuit of FIG. 2A.

When the input clock signals ICLK and ICLK\ have duty cycle distortion as shown in FIG. 2B, the charge time of $C_1$ exceeds the charge time of $C_2$, causing a positive $V_{CP}$ to develop at the output of the charge pump 18. Consequently, $i_{S1}$ is increased and $i_{S2}$ is decreased relative to the balanced bias state. The effect of the increased $i_{S1}$ is to reduce the amount of current available to charge $C_1$ when ICLK is low and to increase the amount of current available to discharge $C_1$ when ICLK is high. Thus, as shown in FIG. 2C, the rising edge rate of OCLK is reduced, delaying the start of the longer half period of the signal (i.e., period T1), and the falling edge rate of OCLK is increased, advancing the end of the longer half period of the signal. In effect, an asymmetric adjustment is made to the rising and falling edge rates of OCLK so that the longer half period (T1) is shortened and the shorter half period (T2) is lengthened to achieve duty cycle correction. The decreased $i_{S2}$ has a complementary effect on OCLK\, advancing the start of the shorter half period of the signal and delaying the end of the shorter half period to achieve duty cycle correction. Because the high going swing of both OCLK and OCLK\ is pulled up to approximately $V_{SUPPLY}$, and the low going swing is clamped at a predetermined voltage (in this example, a diode drop) below the high going swing, the DC levels of the output clock signals are not substantially changed as the falling and rising edge rates are adjusted. Thus, in contrast to the prior art level-shifting corrector described above, the edge-based duty cycle corrector performs duty cycle correction by asymmetrically adjusting the rising and falling edge rates of the input clock signals and without shifting their DC levels. Consequently, the potential loss of clock caused by DC shifting is avoided in the edge-based duty cycle corrector of FIG. 2A.

Having described an edge-based duty cycle correction circuit and its method of operation, it should be noted that various changes may be made to the circuit without departing from the spirit and scope of the invention. As one example, the entire circuit may be inverted with respect to $V_{SUPPLY}$ and ground reference potentials by reversing the polarity of all transistors and current sources (i.e., p-MOS devices replaced with n-MOS devices and vice-versa).

Figure 3A:
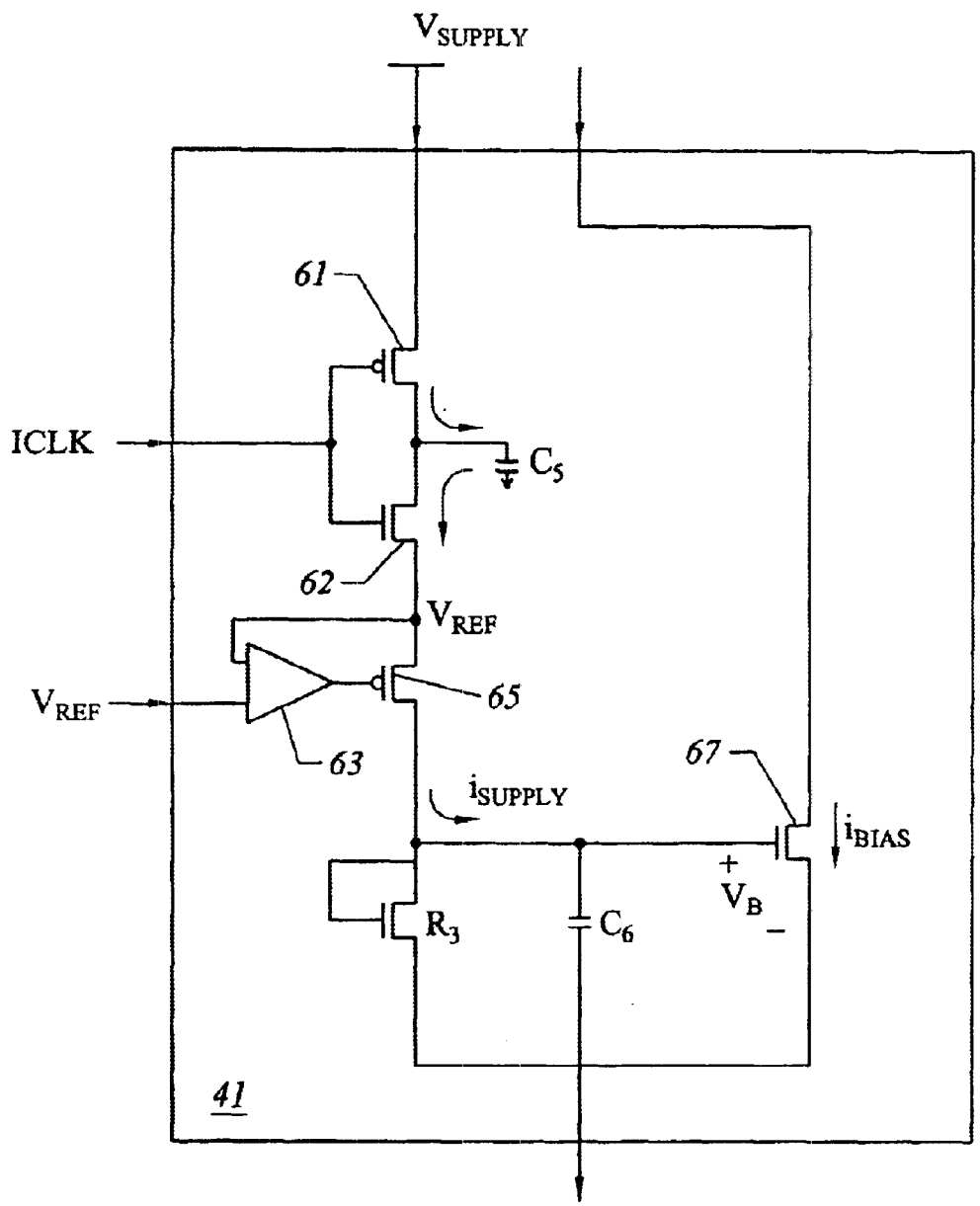
FIG. 3A illustrates an embodiment of a frequency-dependent bias circuit.
Figure 3B:
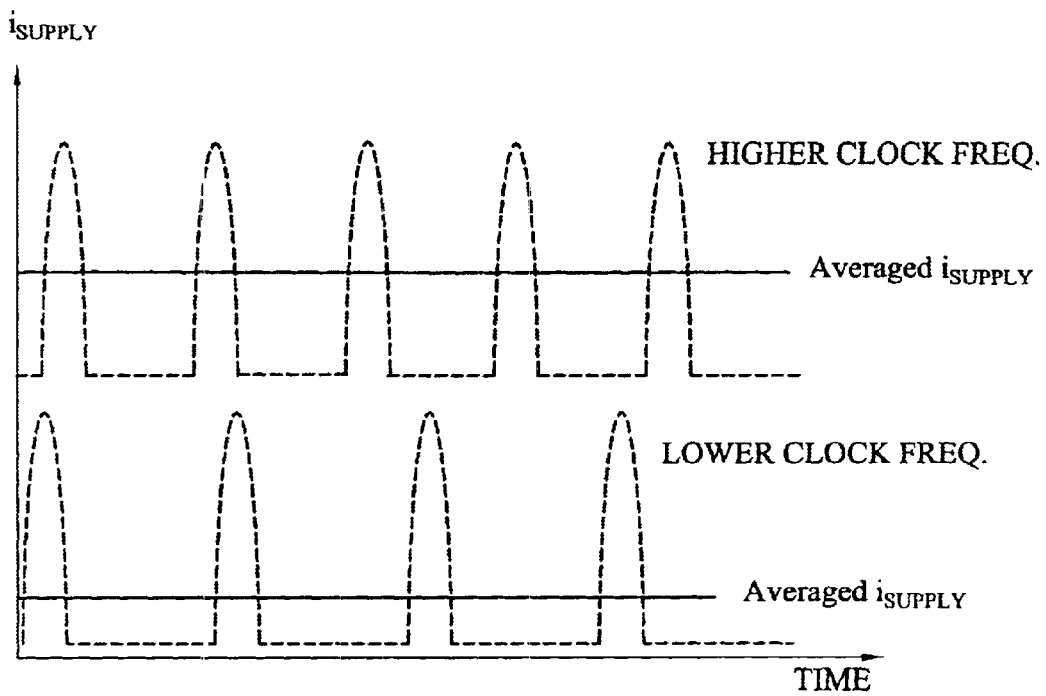
FIG. 3B, illustrates the relationship between current pulses generated by a switched capacitor within the bias circuit of FIG. 3A and the level of current supplied to develop a steady-state bias voltage.
Figure 3C:
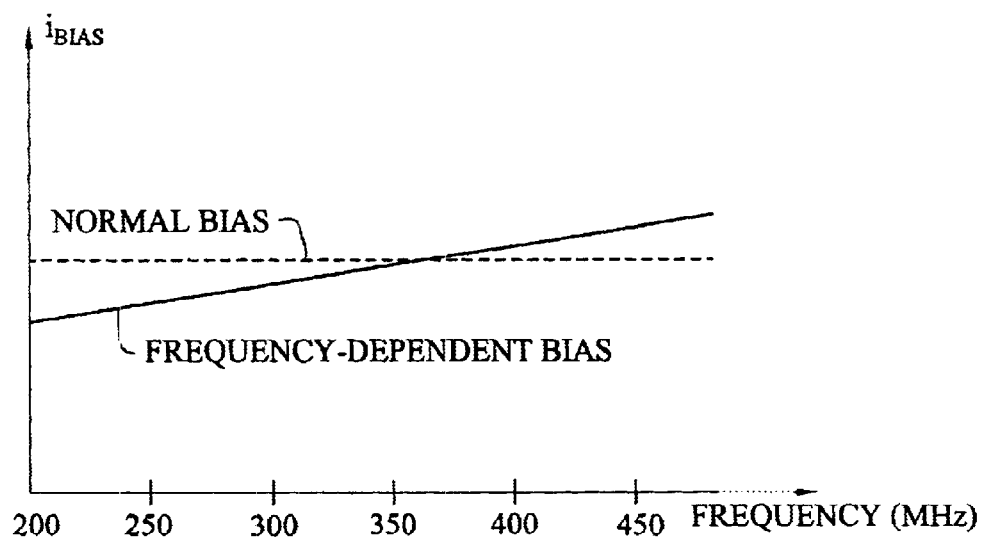
FIG. 3C is a graph of the bias current output by the circuit of FIG. 3A versus input clock frequency.

FIG. 3A illustrates an embodiment of the frequency-dependent bias circuit 41 of FIG. 2A. Complementary MOS transistors 61 and 62 are controlled by the input clock signal, ICLK, to alternately charge and discharge capacitive element $C_5$. In particular, when ICLK goes high, a current pulse is discharged from $C_5$ through transistors 62 and 65 to an RC circuit formed by capacitive element $C_6$ and resistive element $R_3$ (implemented, in this case by a diode-configured n-MOS device), charging $C_6$ with the time constant $R_3C_6$. A buffer amplifier 63 coupled in an input follower configuration is used to maintain a voltage $V_{REF}$ at the drain of transistor 65 so that the amount of current discharged from $C_5$ during the high going cycle of ICLK is essentially independent of the voltage across $C_6$. As shown in FIG. 3B, this arrangement results in a sequence of current pulses being delivered to charge $C_6$ (indicated in FIG. 3A by the arrow labeled $i_{SUPPLY}$) As shown in FIG. 3B, the current pulse frequency corresponds to the ICLK frequency so that $i_{SUPPLY}$ increases with clock frequency. Preferably, the $R_3C_6$ time constant is relatively long compared to the frequency of current pulses which form $i_{SUPPLY}$, causing a steady state bias voltage $V_B$ to develop at the gate of transistor 67 in proportion to the frequency of ICLK. In this way, frequency-dependent biasing circuit 41 generates a bias current $i_{BIAS}$ that increases with frequency as shown in FIG. 3C (a more typical bias current is depicted in FIG. 3C as a dashed line). Although a frequency range of 200 MHz and upward is depicted in FIG. 3C, differently sized capacitive and resistive elements may be selected to operate circuit 41 at other frequency ranges. Similarly, differently sized components can be used to increase or decrease the bias current for a given range of frequencies. Also, numerous variations may be made to circuit 41 without departing from the scope of the present invention. For example, rather than using complementary MOS transistors 61 and 62 to switch current into and out of $C_5$, two n-MOS or two-PMOS transistors may be used instead and gated by complementary clocks (e.g., ICLK and ICLK\). Also, any number of circuits for establishing $V_{REF}$ may be used in place of the input follower, and $V_{REF}$ may be generated within circuit 41 (e.g., by subdividing $V_{SUPPLY}$ to $V_{SUPPLY}/2$ or another fractional voltage) instead of receiving an external reference voltage. (However implemented, the $V_{REF}$ generation circuitry should preferably be designed to deliver the same $V_{REF}$ over a wide process variation.) Moreover, while a switched-capacitor circuit for generating a frequency-dependent bias current has been described, any circuit that generates a frequency-dependent bias current may be used in alternate embodiments. Referring to FIG. 2A, circuits 42 and 43 may also be implemented using the circuit of FIG. 3A, or any alternative circuit that generates a frequency-dependent bias current.

Referring again to the edge-based duty cycle corrector 30 of FIG. 2A, if ICLK and ICLK\ oscillate at a higher frequency than shown in FIG. 2B, then the degree to which edge rates must be increased or decreased in order to correct duty cycle distortion will be commensurately lower. This is precisely the effect produced by using frequency-dependent bias circuits 41, 42 and 43. Because bias currents $i_1$, $i_2$ and $i_3$ all increase with frequency, the amount of current flowing to charge and discharge capacitive elements $C_1$ and $C_2$ is also increased, providing for faster edge rates at higher frequencies of operation. Thus, unlike the prior art level-shifting corrector described above which typically is designed to operate at a particular input clock frequency and requires additional configurable or fusible circuitry to be operated at different input clock frequencies, the edge-based duty corrector 30 can provide effective duty cycle correction over a broad range of input clock frequencies.

Another advantage of the edge-based duty cycle corrector 30 is that the circuit is less sensitive to variation in the speed of its components than the prior art level shifting corrector described above, resulting in a higher yield of acceptable parts and correspondingly lower production costs. In particular, the bias currents generated by the frequency-dependent bias circuits 41, 42 and 43 tend to be lower for circuits with fast components and higher for circuits with slow components—precisely the relationship needed to compensate for process variation in the value of capacitances $C_1$ and $C_2$ in the edge-based corrector of FIG. 2A.

Referring to FIG. 3A, it can be seen that $i_{SUPPLY}$, the current delivered to develop the bias voltage across $C_6$, is directly proportional to the capacitance of $C_5$ ($i_{SUPPLY}$= $C_5$dv/dt). Because, as discussed above, faster components tend to produce smaller-valued capacitive elements, the same process variations which yield smaller capacitive elements $C_1$ and $C_2$ also yield smaller switched capacitors (e.g., $C_5$) within the frequency-dependent bias circuits 41, 42, 43. Thus, smaller bias currents are produced by frequency-dependent bias circuits 41, 42, 43 in the same edge-based duty cycle corrector that has smaller-valued elements $C_1$ and $C_2$. Because the smaller-valued elements $C_1$ and $C_2$ require less current to charge and discharge, this proportionality between bias current level and the capacitive value of elements $C_1$ and $C_2$ allows the edge-based duty cycle corrector 30 of FIG. 2A to tolerate a broader variation between fast and slow components than the prior art level shifting corrector discussed above.

Having described at least some of the benefits of using frequency-dependent bias circuits as shown in FIG. 2A, it should be noted that bias circuits 41, 42 and 43 need not be frequency dependent to achieve an edge-based duty cycle corrector. In particular, if the duty cycle corrector 30 is not expected to operate with a range of input clock frequencies, but rather with a specific clock frequency, more traditional biasing circuits may be used in place of frequency-dependent bias circuits 41, 42 and 43.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   duty cycle detection circuitry to detect duty cycle distortion in a clock signal and to generate an error signal in response thereto; and
   duty cycle correction circuitry coupled to receive the error signal and configured to increase a first edge rate of the clock signal and decrease a second edge rate of the clock signal in response to the error signal to reduce the duty cycle distortion.

2. The apparatus of claim 1 wherein the duty cycle correction circuitry includes a first differential amplifier circuit having first and second output nodes that are alternately pulled up to a predetermined voltage level by first and second current sources, respectively.

3. The apparatus of claim 2 wherein the first differential amplifier circuit includes a first transistor coupled to the first output node and having a control input coupled to receive the clock signal, and a second transistor coupled to the second output node and having a control input coupled to receive a complement of the clock signal, the first and second transistors conducting current from the first and second current sources in response to the clock signal and its complement, respectively, to generate complementary output clock signals.

4. The apparatus of claim 3 wherein the duty cycle correction circuitry further includes a second differential amplifier circuit to draw first and second currents from the first and second output nodes, respectively, the first and second currents differing according to the error signal.

5. The apparatus of claim 4 wherein the second differential amplifier circuit is biased by a current source that generates a bias current in proportion to an operating frequency of the clock signal.

6. The apparatus of claim 3 wherein first and second capacitive elements are coupled to the first and second output nodes, respectively, each of the capacitive elements being charged to a high signal level when its corresponding output node is pulled up and discharged to a low signal level when its corresponding output node is pulled down, the edge rates of the complementary output clock signals being controlled by the amount of current provided to charge and discharge the capacitive elements.

7. The apparatus of claim 6 further comprising a second differential amplifier circuit to draw first and second currents from the first and second output nodes, respectively, the first and second currents differing according to the error signal such that the first edge rate is increased and the second edge rate is decreased to reduce duty cycle distortion of the clock signal.

8. The apparatus of claim 2 wherein the first and second current sources output current to the first and second output nodes in proportion to an operating frequency of the clock signal.

9. The apparatus of claim 2 wherein the first differential amplifier circuit includes first and second transistors biased by a third current source and are coupled to receive current through the first and second output nodes from the first and second current sources, respectively.

10. The apparatus of claim 9 wherein the third current source draws current from the first differential amplifier circuit in proportion to an operating frequency of the clock signal.

11. The apparatus of claim 2 wherein the first and second current sources are implemented by transistors coupled in a current mirror configuration with a transistor biased by a biasing circuit.

12. The apparatus of claim 2 wherein the duty cycle correction circuitry further includes circuitry coupled between the first and second output nodes to limit the differential voltage swing between the first and second output nodes.

13. The apparatus of claim 12 wherein the circuitry coupled between the first and second output nodes to limit the differential voltage swing between the first and second output nodes includes a first diode coupled to conduct current from the first output node to the second output node and a second diode coupled to conduct current from the second output node to the first output node.

14. The apparatus of claim 13 wherein at least one of the first and second diodes is implemented by a diode-configured transistor.

15. The apparatus of claim 2 wherein the duty cycle detection circuitry includes a charge pump circuit having first and second inputs coupled to the first and second output nodes, respectively, and a pair of outputs coupled to first and second capacitive elements, respectively, the charge pump charging the first and second capacitive elements to first and second voltage levels according to a duty cycle of the clock signal, the difference between the first and second voltage levels forming the error signal.

16. The apparatus of claim 15 wherein the duty cycle correction circuitry further includes a buffer amplifier coupled between the first and second output nodes and the first and second inputs of the charge pump.

17. The apparatus of claim 1 wherein the first edge rate is a rising edge rate and the second edge rate is a falling edge rate.

18. The apparatus of claim 1 wherein the first edge rate is a falling edge rate and the second edge rate is a rising edge rate.

19. An apparatus comprising:
a charge storage device coupled to be charged and discharged in response to oscillation of an input clock signal;
control circuitry coupled to the charge storage element, the control circuitry including circuitry to detect duty cycle distortion in the input clock signal and, responsive thereto, to adjust current flowing to charge and discharge the charge storage element to increase an edge rate of the input clock signal when the input clock signal transitions between high and low levels in a first direction and to decrease an edge rate of the input clock signal when the clock signal transitions between high and low levels in a direction opposite the first direction.

20. The apparatus of claim 19 wherein the charge storage device is a first capacitor implemented on a semiconductor substrate and wherein the control circuitry includes at least one biasing circuit having a switched capacitor to deliver current in proportion to the oscillation frequency of the input clock signal, the switched capacitor also being implemented in the semiconductor substrate such that capacitance values of the first capacitor and the switched capacitor change in proportion to one another in response to variations in fabrication process.

21. An apparatus comprising:
means for detecting duty cycle distortion in a clock signal and for generating an error signal in response thereto; and
means for increasing a first edge rate of the clock signal and decreasing a second edge rate of the clock signal in response to the error signal to reduce the duty cycle distortion.

22. The apparatus of claim 21 wherein the means for increasing a first edge rate of the clock signal and decreasing a second edge rate of the clock signal comprises means for increasing a rising edge rate of the clock signal and decreasing a falling edge rate of the clock signal.

23. The apparatus of claim 21 wherein the means for increasing a first edge rate of the clock signal and decreasing a second edge rate of the clock signal comprises means for increasing a falling edge rate of the clock signal and decreasing a rising edge rate of the clock signal.

24. An method comprising:
generating an error signal in proportion to duty cycle distortion in an input clock signal; and
increasing a first edge rate of the input clock signal and decreasing a second edge rate of the input clock signal in response to the error signal to reduce the duty cycle distortion.

25. The method of claim 24 wherein increasing a first edge rate of the input clock signal and decreasing a second edge rate of the input clock signal in response to the error signal comprises increasing a falling edge rate of the input clock signal and decreasing a rising edge rate of the input clock signal.

26. The method of claim 24 wherein increasing a first edge rate of the input clock signal and decreasing a second edge rate of the input clock signal in response to the error signal comprises increasing a rising edge rate of the input clock signal and decreasing a falling edge rate of the input clock signal.

27. A method of reducing duty cycle distortion in an input clock signal, the method comprising:
charging and discharging a charge storage element in response to oscillation of the clock signal; and
dynamically adjusting a current flowing to charge and discharge the charge storage element to increase an edge rate of the clock signal when the clock signal transitions between high and low levels in a first direction and to decrease an edge rate of the clock signal when the clock signal transitions between high and low levels in a direction opposite the first direction.

* * * * *